US012015515B2

(12) United States Patent
Bendotti et al.

(10) Patent No.: US 12,015,515 B2
(45) Date of Patent: Jun. 18, 2024

(54) TRANSMITTER CIRCUIT, CORRESPONDING ISOLATED DRIVER DEVICE, ELECTRONIC SYSTEM AND METHOD OF ENCODING A PULSE-WIDTH MODULATED SIGNAL INTO A DIFFERENTIAL PULSED SIGNAL

(71) Applicant: STMicroelectronics S.r.l., Agrate Brianza (IT)

(72) Inventors: Valerio Bendotti, Vilminore di Scalve (IT); Nicola De Campo, Cura Carpignano (IT); Carlo Curina, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 88 days.

(21) Appl. No.: 17/845,860

(22) Filed: Jun. 21, 2022

(65) Prior Publication Data

US 2022/0417076 A1    Dec. 29, 2022

(30) Foreign Application Priority Data

Jun. 29, 2021   (IT) .................... 102021000017000

(51) Int. Cl.
*H04L 27/36* (2006.01)
*H03K 17/687* (2006.01)
(Continued)

(52) U.S. Cl.
CPC ........... *H04L 27/36* (2013.01); *H03K 17/687* (2013.01); *H03K 19/096* (2013.01); *H03K 19/21* (2013.01); *H04L 25/40* (2013.01)

(58) Field of Classification Search
CPC ..... H04L 27/36; H04L 25/40; H04L 25/0272; H04L 25/4902; H03K 17/687;
(Continued)

(56) References Cited

U.S. PATENT DOCUMENTS

| 6,167,132 A | * | 12/2000 | Krone | .................... H04M 11/06 |
| | | | | 379/406.01 |
| 2006/0279354 A1 | | 12/2006 | Hansen et al. | |
| 2022/0115941 A1 | * | 4/2022 | May | ........................ H02M 1/08 |

FOREIGN PATENT DOCUMENTS

| WO | 2020/011801 A1 | 1/2020 | |
| WO | WO-2020011801 A1 | * 1/2020 | ............. G08C 19/00 |

OTHER PUBLICATIONS

Texas Instruments, "Digital Isolator Design Guide," Developer's Guide, SLLA284, Jan. 2009, 17 pages.

* cited by examiner

*Primary Examiner* — Daniel D Chang
(74) *Attorney, Agent, or Firm* — Seed IP Law Group LLP

(57) ABSTRACT

A transmitter circuit receives a PWM input signal and a clock signal. A logic circuit generates a control signal as a function of the clock signal. The control signal is normally set to high, and is periodically set to low for a transmission time interval when an edge is detected in the clock signal. The transmission time interval is shorter than a half clock period of the clock signal. A tri-state transmitter receives the PWM input signal and the control signal, and produces first and a second output signals at first and second transmitter output nodes, respectively. The output signals have a voltage swing between a positive voltage and a reference voltage. An output control circuit is sensitive to the control signal and is coupled to the first and second transmitter output nodes.

20 Claims, 7 Drawing Sheets

(51) Int. Cl.
*H03K 19/096* (2006.01)
*H03K 19/21* (2006.01)
*H04L 25/40* (2006.01)

(58) Field of Classification Search
CPC ................. H03K 19/096; H03K 19/21; H03K 19/018521; H03K 7/08; H02M 1/08
See application file for complete search history.

TRANSMITTER CIRCUIT, CORRESPONDING ISOLATED DRIVER DEVICE, ELECTRONIC SYSTEM AND METHOD OF ENCODING A PULSE-WIDTH MODULATED SIGNAL INTO A DIFFERENTIAL PULSED SIGNAL

BACKGROUND

Technical Field

The present disclosure relates to transmitter circuits, e.g., for use in isolated gate driver devices.

Isolated gate driver devices may be applied, for instance, in traction inverters, DC/DC converters, on-board chargers (OBC), and belt starter generators (BSG) for electric vehicles (EV) and hybrid electric vehicles (HEV).

Description of the Related Art

Conventional isolated gate driver devices comprise two semiconductor dies arranged in the same package: a low voltage die that usually exchanges signals with a microcontroller, and a high voltage die that includes the driver circuit. The low voltage die and the high voltage die are electrically isolated one from the other by a galvanic isolation barrier, which usually includes one or more high voltage capacitances (HVCap) arranged between the two dies.

BRIEF SUMMARY

One or more embodiments provided herein contribute technical benefits in providing such improved transmitter circuits.

According to one or more embodiments, such technical benefits can be achieved by means of a circuit having the features set forth in the description herein.

One or more embodiments may relate to a corresponding isolated driver device.

One or more embodiments may relate to a corresponding electronic system.

One or more embodiments may relate to a corresponding method of encoding a pulse-width modulated signal into a differential pulsed signal.

In one or more embodiments, a circuit comprises a first input node configured to receive a pulse-width modulated input signal, and a second input node configured to receive a clock signal having a frequency higher than the frequency of the pulse-width modulated input signal. The circuit comprises a logic circuit sensitive to the clock signal and configured to generate a control signal as a function of the clock signal. The control signal is normally set to a first logic value (e.g., high), and is periodically set to a second logic value (e.g., low) for a transmission time interval in response to an edge being detected in the clock signal. The transmission time interval is shorter than half clock period of the clock signal. The circuit comprises a tri-state transmitter coupled to the first input node to receive the pulse-width modulated input signal and sensitive to the control signal. The tri-state transmitter is configured to produce a first output signal at a first transmitter output node and a second output signal at a second transmitter output node. The first output signal and the second output signal have a voltage swing between a positive supply voltage and a reference supply voltage. The circuit comprises an output control circuit sensitive to the control signal and coupled to the first transmitter output node and the second transmitter output node. In response to the control signal having the first logic value, the tri-state transmitter sets the first transmitter output node and the second transmitter output node to a high impedance state, and the output control circuit drives the first transmitter output node and the second transmitter output node to an intermediate voltage level between the positive supply voltage and the reference supply voltage. In response to the control signal having the second logic value, the tri-state transmitter drives the first transmitter output node to the positive supply voltage or to the reference supply voltage according to the logic value of the pulse-width modulated input signal, and drives the second transmitter output node to the positive supply voltage or to the reference supply voltage according to the inverted logic value of the pulse-width modulated input signal. The tri-state transmitter is faster than the output control circuit in driving the first transmitter output node and the second transmitter output node.

One or more embodiments may thus facilitate providing a transmitter circuit for use in an isolated driver device which is robust against noise and does not introduce delay in the signal transmission path, while also having a simple circuit architecture.

In one or more embodiments, the tri-state transmitter may drive the first transmitter output node and the second transmitter output node to the positive supply voltage and to the reference supply voltage with a respective transition time that is at least 100 times shorter than the transition time with which the output control circuit drives the first transmitter output node and the second transmitter output node to the intermediate voltage level.

In one or more embodiments, the tri-state transmitter may drive the first transmitter output node and the second transmitter output node to the positive supply voltage and to the reference supply voltage with a respective transition time in the range of 10 ps to 100 ps, and the output control circuit may drive the first transmitter output node and the second transmitter output node to the intermediate voltage level with a respective transition time in the range of 30 ns to 40 ns.

In one or more embodiments, the logic circuit may comprise a first delay circuit element configured to produce a delayed replica of the clock signal; a first XOR gate configured to receive the clock signal and the delayed replica of the clock signal as input; and an inverter circuit configured to invert the output signal from the first XOR gate to produce the control signal. The transmission time interval may be equal to the delay generated by the first delay circuit element.

In one or more embodiments, the logic circuit may be further sensitive to the pulse-width modulated input signal and may be configured to generate the control signal further as a function of the pulse-width modulated input signal. The control signal may be set to the second logic value for the transmission time interval is in response to an edge being detected in the pulse-width modulated input signal.

In one or more embodiments, the logic circuit may comprise a first delay circuit element configured to produce a delayed replica of the clock signal; a first XOR gate configured to receive the clock signal and the delayed replica of the clock signal as input; a second delay circuit element configured to produce a delayed replica of the pulse-width modulated input signal; a second XOR gate configured to receive the pulse-width modulated input signal and the delayed replica of the pulse-width modulated input signal as input; and a NOR gate configured to receive the output signals from the first XOR gate and the second XOR gate to produce the control signal. The transmission time interval may be equal to the delay generated by the first delay circuit element and by the second delay circuit element.

In one or more embodiments, the tri-state transmitter may comprise a first half-bridge circuit arranged between the positive supply voltage and the reference supply voltage and having an intermediate node coupled to the first transmitter output node; and a second half-bridge circuit arranged between the positive supply voltage and the reference supply voltage and having an intermediate node coupled to the second transmitter output node. A high-side switch of the first half-bridge circuit may be conductive in response to the control signal having the second logic value and the pulse-width modulated input signal having a high logic value. A low-side switch of the first half-bridge circuit may be conductive in response to the control signal having the second logic value and the pulse-width modulated input signal having a low logic value. A high-side switch of the second half-bridge circuit may be conductive in response to the control signal having the second logic value and the pulse-width modulated input signal having a low logic value. A low-side switch of the second half-bridge circuit may be conductive in response to the control signal having the second logic value and the pulse-width modulated input signal having a high logic value. The high-side switch and the low-side switch of the first half-bridge circuit, as well as the high-side switch and the low-side switch of the second half-bridge circuit, may be non-conductive in response to the control signal having the first logic value.

In one or more embodiments, the output control circuit may comprise a voltage divider arranged between the positive supply voltage and the reference supply voltage; and respective switches configured to selectively couple an intermediate node of the voltage divider to the first transmitter output node and to the second transmitter output node in response to the control signal having the first logic value.

In one or more embodiments, the circuit may comprise a protection circuit. The protection circuit may comprise a first protection capacitance, a second protection capacitance, and protection circuitry. The protection circuitry may be configured to charge the first protection capacitance to the positive supply voltage in response to the control signal having the second logic value and the pulse-width modulated input signal having a high logic value; and charge the first protection capacitance to the reference supply voltage in response to the control signal having the second logic value and the pulse-width modulated input signal having a low logic value. The protection circuitry may be configured to charge the second protection capacitance to the positive supply voltage in response to the control signal having the second logic value and the pulse-width modulated input signal having a low logic value; and charge the second protection capacitance to the reference supply voltage in response to the control signal having the second logic value and the pulse-width modulated input signal having a high logic value. The protection circuitry may be configured to couple the first protection capacitance to the first transmitter output node and couple the second protection capacitance to the second transmitter output node in response to the control signal having the first logic value.

In one or more embodiments, the circuit may comprise a first differential output node and a second differential output node; a first isolation capacitance coupled between the first transmitter output node and the first differential output node; and a second isolation capacitance coupled between the second transmitter output node and the second differential output node. A differential output signal indicative of the pulse-width modulated input signal may be produced between the first differential output node and the second differential output node.

In one or more embodiments, an isolated driver device may comprise a first semiconductor die having a transmitter circuit according to one or more embodiments implemented thereon; and a second semiconductor die having a first receiver input node and a second receiver input node. The first receiver input node may be electrically coupled to the first differential output node of the transmitter circuit and the second receiver input node may be electrically coupled to the second differential output node of the transmitter circuit to receive the differential output signal. The second semiconductor die may have a receiver circuit implemented thereon. The receiver circuit may be configured to receive the differential output signal, and to set a driving signal to a first logic value in response to a positive pulse being detected in the differential output signal and to a second logic value in response to a negative pulse being detected in the differential output signal.

In one or more embodiments, the second semiconductor die may have a driver circuit implemented thereon. The driver circuit may include a half-bridge circuit arranged between a positive supply voltage pin and a reference supply voltage pin and driven by the driving signal to produce an output switching signal.

In one or more embodiments, an electronic system may comprise a processing unit configured to generate the pulse-width modulated input signal and the clock signal; and an isolated driver device according to one or more embodiments, the isolated driver device being coupled to the processing unit to receive the pulse-width modulated input signal and the clock signal.

In one or more embodiments, a method of encoding a pulse-width modulated signal into a differential pulsed signal comprises receiving the pulse-width modulated signal; providing a clock signal having a frequency higher than the frequency of the pulse-width modulated signal; and generating a control signal as a function of the clock signal. The control signal is normally set to a first logic value, and is periodically set to a second logic value for a transmission time interval in response to an edge being detected in the clock signal. The transmission time interval is shorter than half clock period of the clock signal. The method further comprises producing a first output signal and a second output signal, the first output signal and the second output signal having a voltage swing between a positive supply voltage and a reference supply voltage; and applying capacitive filtering to the first output signal and the second output signal to produce respective first and second filtered output signals, wherein the differential pulsed signal is produced as a difference between the first filtered output signal and the second filtered output signal. Producing the first output signal and the second output signal comprises setting the first output signal and the second output signal to an intermediate voltage level between the positive supply voltage and the reference supply voltage, in response to the control signal having the first logic value. Producing the first output signal and the second output signal comprises setting the first output signal to the positive supply voltage or to the reference supply voltage according to the logic value of the pulse-width modulated input signal, and setting the second output signal to the positive supply voltage or to the reference supply voltage according to the inverted logic value of the pulse-width modulated input signal, in response to the control signal having the second logic value. A time interval for setting the first output signal and the second output signal to the positive supply voltage or to the reference supply voltage is shorter than a time interval for setting the first output signal and the second output signal to the intermediate voltage level.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
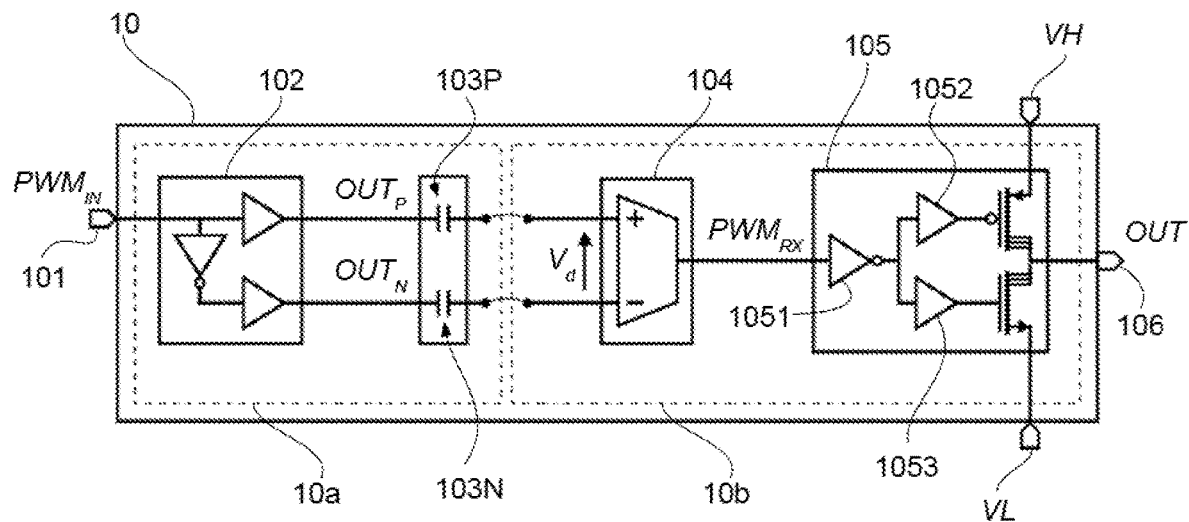
FIG. 1 is a circuit block diagram exemplary of an isolated gate driver device.
Figure 2:
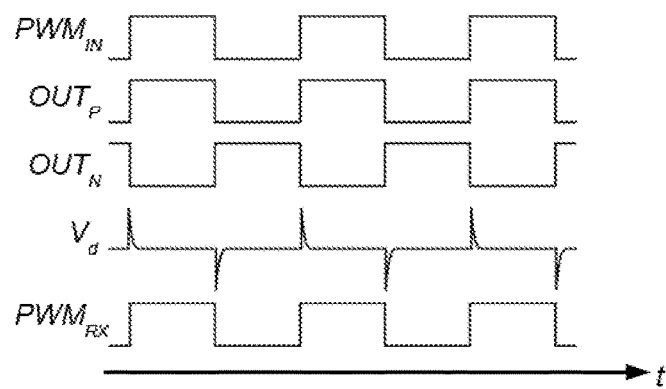
FIGS. 2 and 3 are time diagrams of signals in the isolated gate driver device of FIG. 1.
Figure 3:
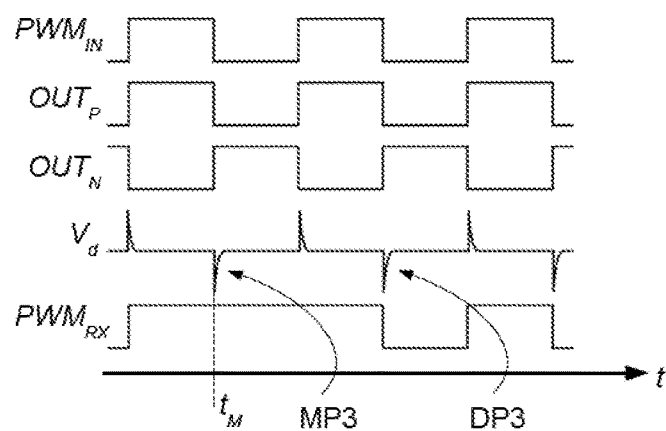

FIG. 1 is a circuit block diagram exemplary of an isolated gate driver device. FIGS. 2 and 3 are time diagrams of signals in the isolated gate driver device of FIG. 1, which are exemplary of possible operation of the gate driver device.

As exemplified in FIG. 1, the isolated gate driver device 10 comprises a low voltage die 10a and a high voltage die 10b in the same package. The gate driver device 10 comprises an input pin 101 configured to receive a single ended pulse-width modulated input signal $PWM_{IN}$ (e.g., from a microcontroller, not visible in FIG. 1). The frequency of the input signal $PWM_{IN}$ may be, for instance, in the range of 15 kHz to 5 MHz. The low voltage die 10a comprises a transmitter circuit 102 coupled to the input pin 101 and configured to convert the received single ended signal $PWM_{IN}$ into a pair of differential pulse-width modulated signals $OUT_P$, $OUT_N$. For instance, signal $OUT_P$ may be generated at the output of a buffer circuit that receives the input signal $PWM_{IN}$ at input, and signal $OUT_N$ may be generated at the output of another buffer circuit that receives an inverted replica of the input signal $PWM_{IN}$ at input. The low voltage die 10a further comprises a first high voltage capacitance 103P (e.g., an isolation capacitance) having a first terminal coupled to the first output of the transmitter circuit 102 to receive signal $OUT_P$, and a second high voltage capacitance 103N (e.g., an isolation capacitance) having a first terminal coupled to the second output of the transmitter circuit 102 to receive signal $OUT_N$. The second terminals of the capacitances 103P and 103N provide the output nodes of the low voltage die 10a, which are connected (e.g., via bonding wires) to the input nodes of the high voltage die 10b. The signals $OUT_P$, $OUT_N$ are filtered by the isolation capacitances 103P, 103N so that a pulsed differential signal $V_d$ reaches the high voltage die 10b. The differential signal $V_d$ comprises a train of pulses (positive and negative) corresponding to the edges (rising and falling, respectively) of the input PWM signal $PWM_{IN}$, as exemplified in FIG. 2. The high voltage die 10b comprises a receiver circuit 104 coupled to the input nodes of the die 10b to receive the differential signal $V_d$, and configured to produce a reconstructed pulse-width modulated signal $PWM_{RX}$ as a function of the received differential signal $V_d$. For instance, the receiver circuit 104 may be configured to set the signal $PWM_{RX}$ to a high logic value ('1') as a result of a positive pulse being detected in the differential signal $V_d$, and to a low logic value ('0') as a result of a negative pulse being detected in the differential signal $V_d$, as exemplified in FIG. 2. Therefore, the reconstructed signal $PWM_{RX}$ may substantially correspond to a (slightly) delayed copy of the transmitted signal $PWM_{IN}$, as exemplified in FIG. 2. The high voltage die 10b comprises a driver stage 105 including a pre-driver circuit (e.g., buffers 1051, 1052, 1053) configured to receive the reconstructed signal $PWM_{RX}$ and drive an output switching circuit as a function thereof (e.g., inverting at inverter 1051 and/or amplifying at buffers 1052, 1053 the reconstructed signal $PWM_{RX}$). For instance, the output switching circuit may comprise a half-bridge driving stage comprising a high-side transistor and a low-side transistor arranged in series between a high voltage supply pin VH and a high voltage reference pin VL of the gate driver device 10. A node intermediate the high-side transistor and the low-side transistor may be electrically coupled to an output pin 106 of the gate driver device 10. The high-side transistor and the low-side transistor are driven by the pre-driver circuit 1051, 1052, 1053 so that an output switching signal OUT is produced at the output pin 106 (e.g., the high-side transistor is in a conductive state when $PWM_{RX}=1$ and the low-side transistor is in a conductive state when $PWM_{RX}=0$).

In various applications, a gate driver device as exemplified in FIG. 1 may be placed (e.g., operated) in a noisy environment. Therefore, for some unpredictable and/or unforeseen reason (e.g., disturbances, interferences, spurious spikes, etc.), one or more pulses in the differential signal $V_d$ may occasionally not be decoded (e.g., detected) by the receiver circuit 104, as exemplified in the time diagrams of FIG. 3, where a negative pulse MP3 of signal $V_d$ is not detected by the receiver circuit 104. In such cases, the reconstructed signal $PWM_{RX}$ may not switch to the expected value and may retain its last value (as exemplified by signal $PWM_{RX}$ that remains stationary at a high logic value at instant $t_M$, when it should switch to a low logic value instead). The reconstructed signal $PWM_{RX}$ switches again at the next "useful" edge correctly detected (e.g., the next falling edge DP3, as exemplified in FIG. 3, if the missed edge was a falling one). In other cases, to the contrary, unexpected spikes (e.g., due to disturbances) in the differential signal $V_d$ may generate spurious, unwanted commutations of the reconstructed signal $PWM_{RX}$.

Figure 4:
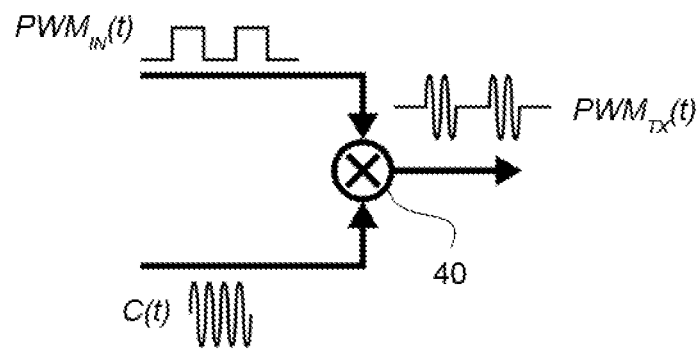
FIGS. 4, 5 and 6 are diagrams schematically illustrating using on-off keying (OOK) modulation of the input signal of the isolated gate driver device of FIG. 1.
Figure 5:
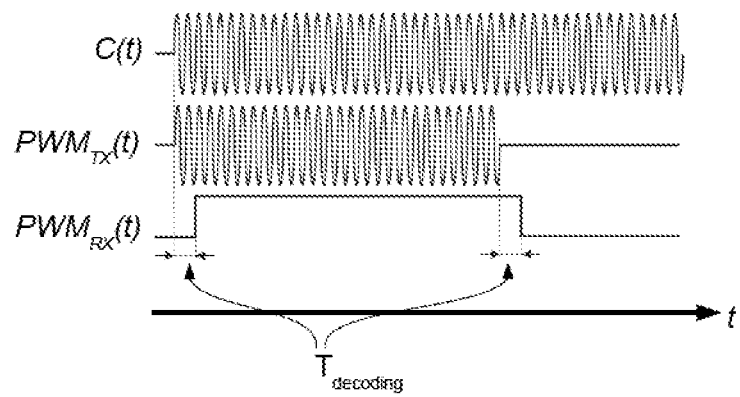
Figure 6:
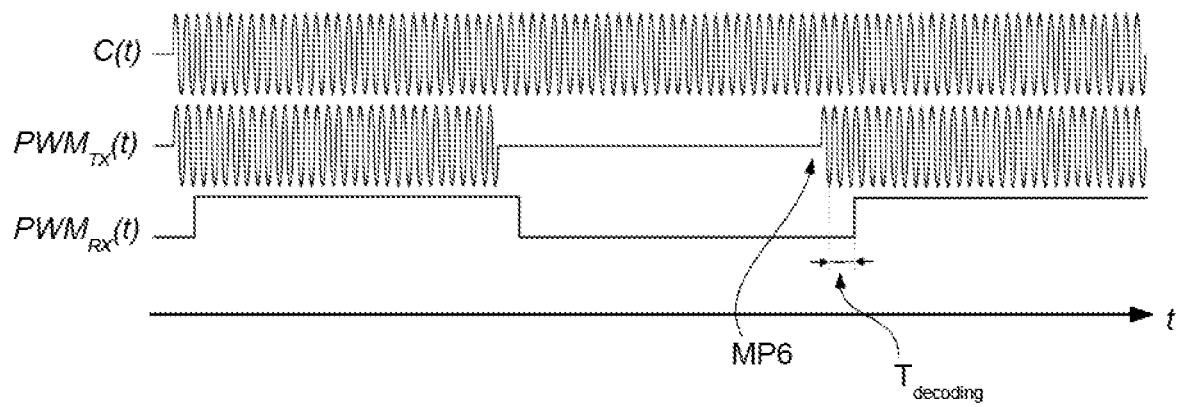

In order to mitigate the above-discussed issue (i.e., the issue of missing "good" pulses and/or detecting "spurious" pulses in the signal $V_d$ at the input of the high voltage die 10b), a conventional approach may rely on using on-off keying (OOK) modulation of the input signal $PWM_{IN}$, as exemplified in FIGS. 4, 5 and 6. In this case, the low voltage die 10a of the gate driver device 10 comprises a mixer circuit 40 that receives the input signal $PWM_{IN}(t)$ and a high frequency carrier signal C(t) (e.g., a sinusoidal signal having a frequency in the range of 100 MHz to 500 MHz) and produces an OOK-modulated signal $PWM_{TX}(t)$ for transmission to the transmitter circuit 102, according to the known equations of OOK modulation, reproduced in the following:

$$PWM_{TX}(t) = \begin{cases} C(t), & \text{if } PWM_{IN} = 1 \\ 0, & \text{if } PWM_{IN} = 0 \end{cases}$$

or, equivalently:

$PWM_{TX}(t) = PWM_{IN}(t) \cdot C(t)$

Additionally, the low voltage die 10a of the gate driver device 10 may comprise an oscillator circuit for generating the high frequency carrier signal C(t).

According to this approach, the receiver circuit 104 may be configured to count a number N of pulses (e.g., N=2 as exemplified in FIGS. 5 and 6) to reconstruct the PWM signal $PWM_{RX}$. After receiving a number N of pulses, the receiver circuit 104 asserts (e.g., sets to a high logic value) the reconstructed signal $PWM_{RX}$. Otherwise, the reconstructed signal $PWM_{RX}$ remains de-asserted (e.g., set to a low logic value). If the receiver circuit 104 misses a pulse, it may still be able to reconstruct the signal $PWM_{RX}$, insofar as it will start counting the pulses from the pulse that immediately follows the missed one: see, for instance, the missed pulse MP6 in FIG. 6, with the output signal $PWM_{RX}(t)$ being asserted (e.g., set to a high logic value) at the third pulse of signal $PWM_{TX}(t)$, because the receiver circuit 104 started counting on the second pulse instead of the first one. The higher is the frequency of the carrier signal C(t), the faster is the receiver circuit in correcting the value of the reconstructed signal $PWM_{RX}$.

However, an approach based on OOK modulation introduces a delay in the communication between the low voltage die 10a and the high voltage die 10b, insofar as the receiver circuit 104 needs a time interval $T_{decoding}$ before assigning the right value to the reconstructed signal $PWM_{RX}$ at each commutation thereof, as exemplified in FIGS. 5 and 6. The time interval $T_{decoding}$ is substantially equal to N times the period of the carrier signal C(t), N being again the number of pulses detected (e.g., counted) before assigning a new value (e.g., asserting and/or de-asserting) to the signal $PWM_{RX}(t)$.

One or more embodiments may provide an improved transmitter circuit for use in an isolated driver device, based on the recognition that a receiver circuit in the high voltage die of the driver device may be configured to generate a reconstructed PWM signal $PWM_{RX}$ by setting the signal $PWM_{RX}$ to a high logic value ('1') in response to a positive pulse being detected in the input differential signal $V_d$, and setting the signal $PWM_{RX}$ to a low logic value ('0') in response to a negative pulse being detected in the input differential signal $V_d$, as previously discussed with reference to FIGS. 1 to 3.

Figure 7:
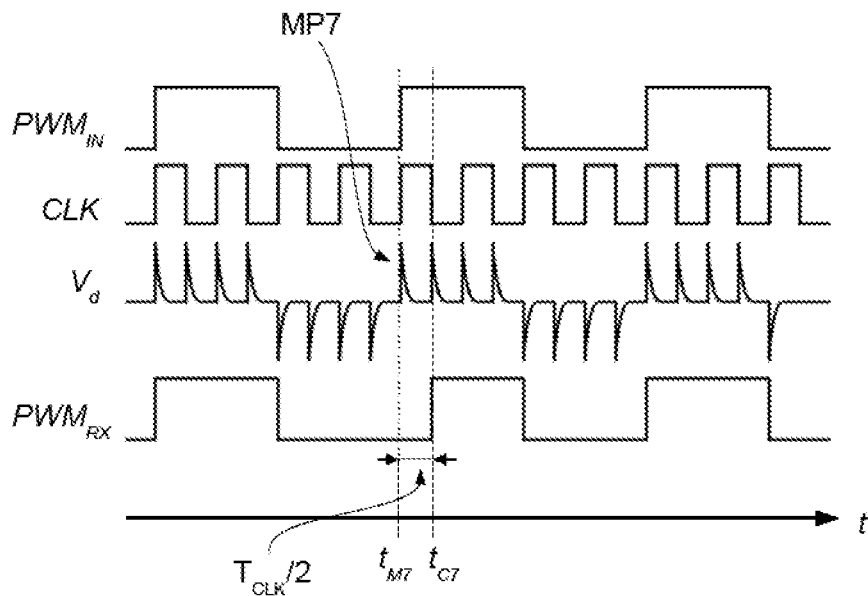
FIG. 7 is exemplary of time diagrams of signals in one or more embodiments of the present description.

Therefore, one or more embodiments may rely on the operating principle exemplified in the time diagrams of FIG. 7 and discussed in the following. In one or more embodiments, a transmitter circuit may comprise circuitry configured to convert the received single ended signal $PWM_{IN}$ into a pair of differential pulse-width modulated signals $OUT_P$, $OUT_N$ that comprise continuous trains of pulses (e.g., a respective train of pulses for each commutation of the input signal $PWM_{IN}$). The pulses are generated continuously by resorting to a clock signal CLK having a frequency higher than the frequency of signal $PWM_{IN}$, so that even if a pulse is lost, the signal $PWM_{RX}$ (reconstructed at the receiver side) can switch correctly at the next pulse. Therefore, in one or more embodiments a transmitter circuit may be configured to generate a pair of signals $OUT_P$ and $OUT_N$ that, once filtered by the capacitances 103P and 103N, produce a differential signal $V_d$ having pulses both at the edges of the input signal $PWM_{IN}$ and at the edges of the clock signal CLK. The pulses in the differential signal $V_d$ have a sign (positive or negative) that depends on the level (e.g., logic value) of the input signal $PWM_{IN}$. For instance, as exemplified in FIG. 7, the differential signal $V_d$ may include a positive pulse at each edge (rising or falling) of signals $PWM_{IN}$ and CLK when $PWM_{IN}$ has a high logic value, and a negative pulse at each edge (rising or falling) of signals $PWM_{IN}$ and CLK when $PWM_{IN}$ has a low logic value. According to this operating principle, the receiver circuit 104 in the high voltage die 10b of the isolated driver device may be able to "correct" the value of the reconstructed signal $PWM_{RX}$, in the case of a missed pulse and/or spurious pulse, with a delay (e.g., maximum delay) of half clock period. The time diagrams of FIG. 7 illustrate an exemplary case where a pulse MP7 is missed by the receiver circuit at instant $t_{M7}$, and the reconstructed signal $PWM_{RX}$ is assigned the correct value (high, in the case exemplified herein) at instant $t_{C7}$, after a time interval equal to $T_{CLK}/2$.

Figure 8:
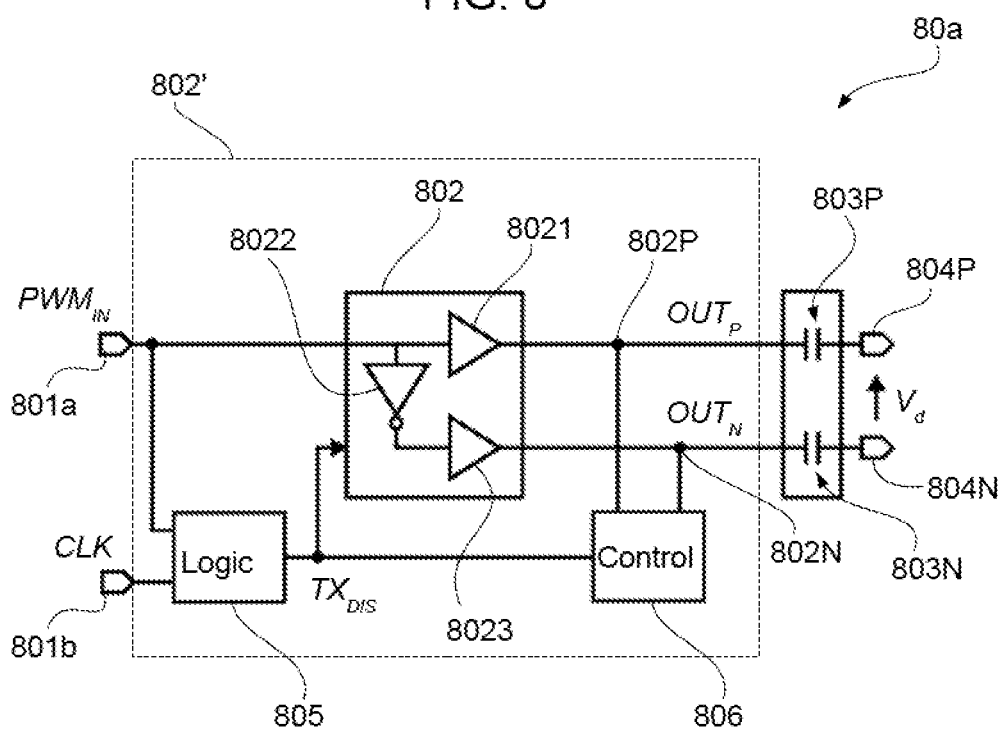
FIG. 8 is a circuit block diagram exemplary of a transmitter circuit according to one or more embodiments of the present description.

Therefore, one or more embodiments may relate to a transmitter circuit 802' (possibly formed in a low voltage die 80a of an otherwise conventional isolated driver device 10) as exemplified in the circuit block diagram of FIG. 8.

The transmitter circuit 802' comprises an input pin 801a configured to receive a single ended pulse-width modulated input signal $PWM_{IN}$, and an input pin 801b configured to receive a clock signal CLK having a frequency higher than the frequency of the input signal $PWM_{IN}$. For instance, the frequency of the input signal $PWM_{IN}$ may be in the range of 15 kHz to 5 MHz. The frequency of the clock signal CLK may be from 2 times higher to 100 times higher than the frequency of the input signal $PWM_{IN}$; optionally, the frequency of the clock signal CLK may be about 50 times higher than the frequency of the input signal $PWM_{IN}$. For instance, the frequency of the clock signal CLK may be in the range of 8 MHz to 40 MHz; optionally, the frequency of the clock signal CLK may be about 10 MHz. The signals $PWM_{IN}$ and CLK may be received from an external circuit, e.g., a microcontroller not visible in the Figures annexed herein.

The transmitter circuit 802' comprises a tri-state transmitter 802 coupled to the input pin 801a and configured to convert the received single ended signal $PWM_{IN}$ into a pair of differential pulse-width modulated signals $OUT_P$, $OUT_N$. For instance, signal $OUT_P$ may be generated at the output of a buffer circuit 8021 that receives the input signal $PWM_{IN}$ at input, and signal $OUT_N$ may be generated at the output of another buffer circuit 8023 that receives an inverted replica (e.g., via inverter 8022) of the input signal $PWM_{IN}$ at input. The die 80a comprises a first high voltage capacitance 803P (e.g., an isolation capacitance) having a first terminal coupled to the first output of the tri-state transmitter 802 (e.g., coupled to the output node 802P of buffer 8021) to receive signal $OUT_P$, and a second high voltage capacitance 803N (e.g., an isolation capacitance) having a first terminal coupled to the second output of the tri-state transmitter 802 (e.g., coupled to the output node 802N of buffer 8023) to receive signal $OUT_N$. The second terminals of the capacitances 803P, 803N provide the output nodes 804P, 804N of the low voltage die 80a, which can be connected (e.g., via bonding wires) to the input nodes of a high voltage die (e.g., including a receiver circuit), in a configuration as exemplified in FIG. 1. The signals $OUT_P$, $OUT_N$ are filtered by the isolation capacitances 803P, 803N so that a differential signal $V_d$ is produced at the output nodes 804P, 804N.

The output buffers 8021, 8023 of the tri-state transmitter 802 have three possible output states. In the "high" output state, a pull-up path (e.g., a pull-up transistor) is active (e.g., conductive) and the output node of the buffer is forced to a high value, such as a power supply voltage level $V_{DD}$. In the "low" output state, a pull-down path (e.g., a pull-down transistor) is active (e.g., conductive) and the output node of the buffer is forced to a low value, such as a negative or reference voltage level $V_{SS}$. In the "high impedance" (HIZ) output state, both the pull-up path and the pull-down path are inactive (e.g., non conductive or off) and the output node of the buffer can be driven externally.

The transmitter circuit 802' comprises a logic circuit 805 configured to receive signals $PWM_{IN}$ and CLK. The logic circuit 805 is configured to produce a control signal $TX_{DIS}$ that is propagated to the tri-state transmitter 802 to control the operating state of buffers 8021, 8023. The control signal $TX_{DIS}$ may be generated by the logic circuit 805 as a pulsed signal that normally has a first value (e.g., a high logic value) and switches to a second value (e.g., a low logic value) for a short time $T_{HIZ}$ each time that an edge (e.g., both rising and falling edges) is detected in the clock signal CLK or in the input signal $PWM_{IN}$. For instance, the time interval $T_{HIZ}$ may be in the range of $0.2*T_{CLK}$ to $0.25*T_{CLK}$ ($T_{CLK}$ being the period of the clock signal CLK). For instance, the time interval $T_{HIZ}$ may be in the range of 8 ns to 12 ns; optionally, the time interval $T_{HIZ}$ may be about 10 ns. The buffers 8021, 8023 may be forced to the high impedance state when the control signal $TX_{DIS}$ has the first value (e.g., high).

The transmitter circuit 802' comprises an output control circuit 806 configured to receive the control signal $TX_{DIS}$ and configured to drive the output nodes 802P and 802N of buffers 8021 and 8023 (i.e., signals $OUT_P$ and $OUT_N$) when the buffers 8021 and 8023 are in the high impedance state. In particular, the output control circuit 806 is configured to force signals $OUT_P$ and $OUT_N$, during the high impedance state of buffers 8021 and 8023 (e.g., when the control signal $TX_{DIS}$ has the first value), to a voltage $V_X$ that is intermediate between the minimum and maximum values of signals $OUT_P$ and $OUT_N$ (e.g., at the center of the swing range of signals $OUT_P$ and $OUT_N$).

Figure 9:
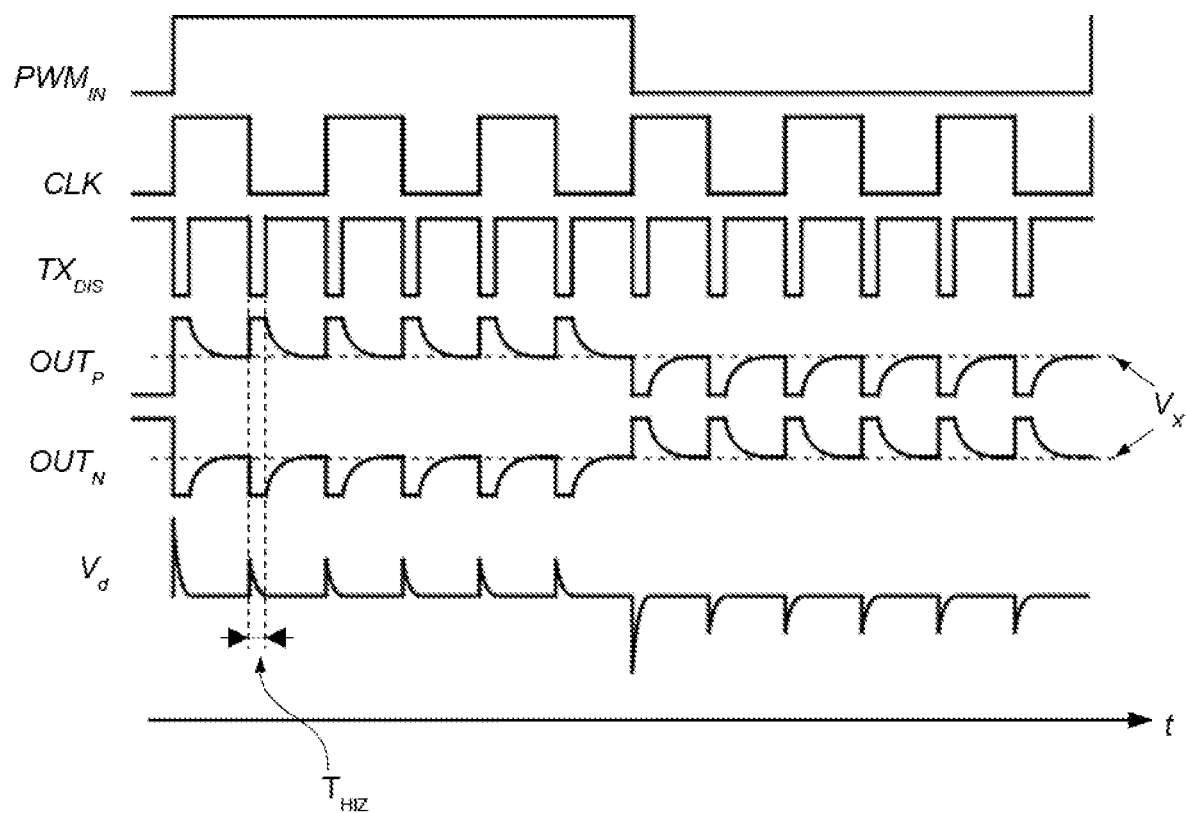
FIG. 9 is exemplary of time diagrams of signals in one or more embodiments of the present description.

Operation of a transmitter circuit 802' as exemplified in FIG. 8 can be further understood with reference to FIG. 9, which illustrates exemplary time diagrams of signals $PWM_{IN}$, CLK, $TX_{DIS}$, $OUT_P$, $OUT_N$ and $V_d$ as possibly received and produced in the transmitter circuit 802' and low voltage die 80a.

For instance, the control signal $TX_{DIS}$ may be normally set to a high logic value ('1'). As a result of the control signal $TX_{DIS}$ being high, the tri-state transmitter 802 is in the high impedance state (i.e., both buffers 8021 and 8023 are in the high impedance state) and the signals $OUT_P$ and $OUT_N$ are forced to value $V_X$ by the output control circuit 806. Each time that an edge (both rising edges and falling edges) occurs in signal CLK or signal $PWM_{IN}$, the control signal $TX_{DIS}$ is set by the logic circuit 805 to a low logic value ('0') for a short period of time $T_{HIZ}$. As a result of the control signal $TX_{DIS}$ being low, the tri-state transmitter 802 operates normally, i.e., signals $OUT_P$ and $OUT_N$ are driven by buffers 8021 and 8023 as a function of the value of the input signal $PWM_{IN}$ (e.g., with signal $OUT_P$ having the same polarity as signal $PWM_{IN}$, and signal $OUT_N$ having the opposite polarity of signal $PWM_{IN}$). The transition from the high impedance state to the active states (high or low) of the buffers 8021 and 8023 is fast. Therefore, the transitions of signals $OUT_P$ and $OUT_N$ from the intermediate value $V_X$ to the extreme values (minimum or maximum) are sharp (e.g., may have a duration in the range of 10 ps to 100 ps). Since signals $OUT_P$ and $OUT_N$ are filtered by the capacitances 803P and 803N, corresponding pulses are produced in the differential signal $V_d$, as exemplified in FIG. 9.

After a time interval $T_{HIZ}$ (determined by the logic circuit 805), the control signal $TX_{DIS}$ returns to its normal value (e.g., high in the example considered herein), so that the hi-state transmitter 802 returns in the high impedance state and signals $OUT_P$ and $OUT_N$ are again forced to value $V_X$ by the output control circuit 806. The transitions of signals $OUT_P$ and $OUT_N$ from the extreme values (minimum or maximum) to the intermediate value $V_X$ are slow (e.g., may have a duration in the range of 30 ns to 40 ns, or generally some orders of magnitude higher than the duration of the transitions from the intermediate value $V_X$ to the extreme values). Since signals $OUT_P$ and $OUT_N$ are filtered by the capacitances 803P and 803N, no pulses (or negligible pulses) are produced in the differential signal $V_d$, as exemplified in FIG. 9.

Figure 10:
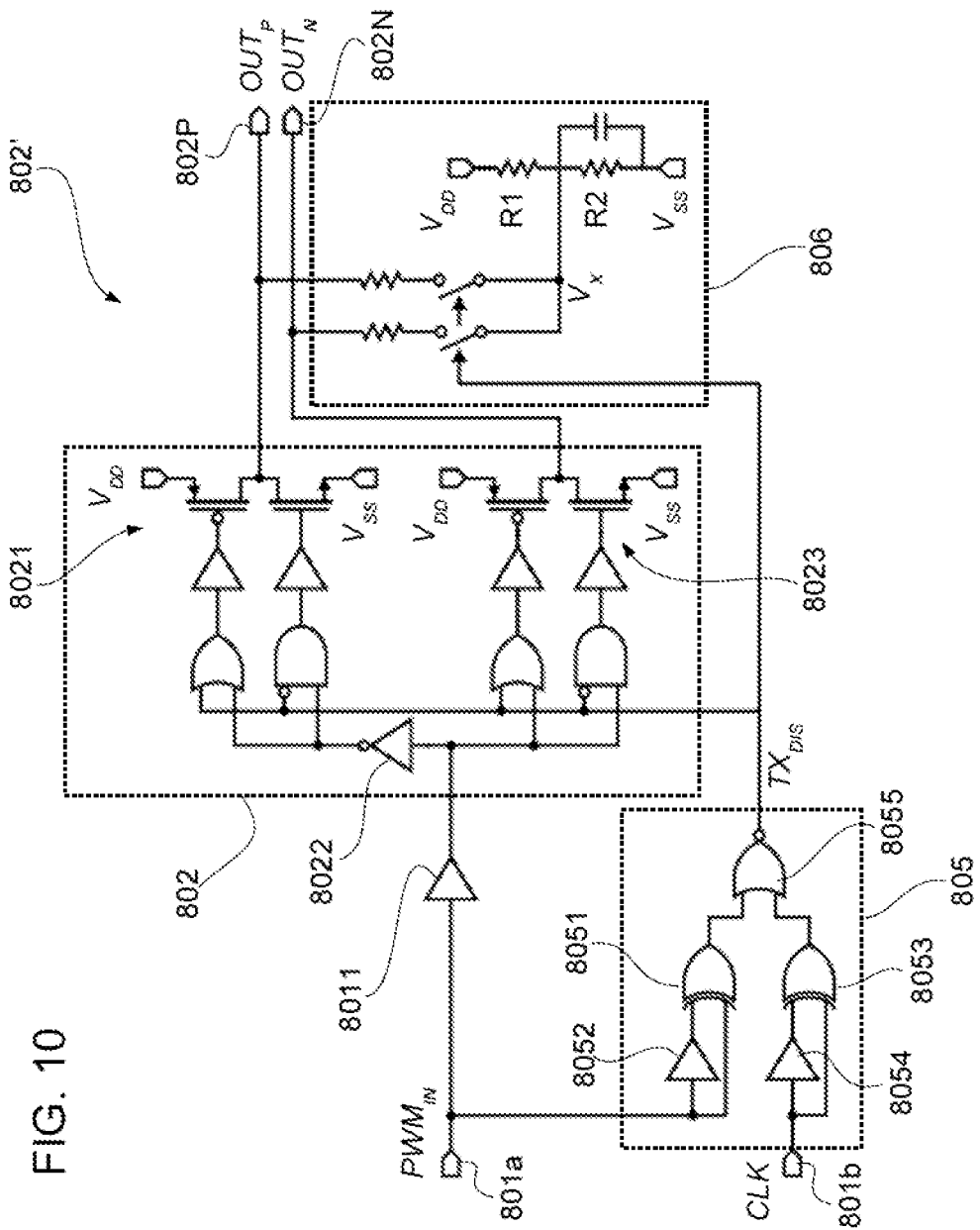
FIGS. 10 and 11 are circuit diagrams exemplary of implementation details of transmitter circuits according to one or more embodiments of the present description.

FIG. 10 is a circuit diagram exemplary of a possible implementation of a transmitter circuit 802' according to one or more embodiments. In particular, FIG. 10 is exemplary of possible implementation details of the logic circuit 805, the tri-state transmitter 802 and the output control circuit 806.

As exemplified in FIG. 10, the logic circuit 805 may comprise a first XOR gate 8051 configured to receive the input signal $PWM_{IN}$ and a delayed replica of the input signal $PWM_{IN}$ (e.g., delayed by means of an interposed buffer stage 8052). The logic circuit 805 may comprise a second XOR gate 8053 configured to receive the clock signal CLK and a delayed replica of the clock signal CLK (e.g., delayed by means of an interposed buffer stage 8054). Therefore, the signal produced by the XOR gate 8051 is set to a high logic value at each commutation (edge) of signal $PWM_{IN}$, and maintains the high logic value (only) for a (short) time period $T_{HIZ}$ equal to the delay of the buffer stage 8052. Similarly, the signal produced by the XOR gate 8053 is set to a high logic value at each commutation (edge) of signal CLK, and maintains the high logic value (only) for a (short) time period $T_{HIZ}$ equal to the delay of the buffer stage 8054. The delays of the buffer stages 8052 and 8054 may be equal. The logic circuit 805 may comprise a NOR gate 8055 configured to receive the signals produced by the XOR gates 8051 and 8053, thereby producing the control signal $TX_{DIS}$ that is normally high and goes too low for a (short) time period $T_{HIZ}$ at each commutation (edge) of signal $PWM_{IN}$ or signal CLK, as discussed with reference to FIG. 9.

As exemplified in FIG. 10, the tri-state transmitter circuit 802 may comprise a first buffer stage 8021 and a second buffer stage 8023.

The first buffer stage 8021 may comprise a half-bridge circuit connected between a positive supply voltage node $V_{DD}$ and a negative or reference supply voltage node $V_{SS}$. The half-bridge circuit may comprise a high-side transistor (e.g., p-channel MOS transistor) and a low-side transistor (e.g., n-channel MOS transistor). A node 802P intermediate the high-side transistor and the low-side transistor may be configured to produce the signal $OUT_P$. The high-side transistor may be controlled by a respective control signal produced by an OR gate that receives signal $TX_{DIS}$ and an inverted replica of signal $PWM_{IN}$ as input signals. A buffer or delay stage may be coupled between the output of the OR gate and the control terminal of the high-side transistor. Therefore, the high-side transistor may be active (and signal $OUT_P$ may be forced to the high value $V_{DD}$) when $TX_{DIS}=0$ and $PWM_{IN}=1$. The low-side transistor may be controlled by a respective control signal produced by an AND gate that receives an inverted replica of signal $TX_{DIS}$ and an inverted replica of signal $PWM_{IN}$ as input signals. A buffer or delay stage may be coupled between the output of the AND gate and the control terminal of the low-side transistor. Therefore, the low-side transistor may be active (and signal $OUT_P$ may be forced to the low value $V_{SS}$) when $TX_{DIS}=0$ and $PWM_{IN}=0$. Both the high-side transistor and the low-side transistor may be inactive (and signal $OUT_P$ may be forced to the intermediate value $V_X$ under the operation of the output control circuit 806) when $TX_{DIS}=1$, irrespective of the value of signal $PWM_{IN}$.

Similarly, the second buffer stage 8023 may comprise a half-bridge circuit connected between the positive supply voltage node $V_{DD}$ and the negative or reference supply voltage node $V_{SS}$. The half-bridge circuit may comprise a high-side transistor (e.g., p-channel MOS transistor) and a low-side transistor (e.g., n-channel MOS transistor). A node 802N intermediate the high-side transistor and the low-side transistor may be configured to produce the signal $OUT_N$. The high-side transistor may be controlled by a respective control signal produced by an OR gate that receives signal $TX_{DIS}$ and signal $PWM_{IN}$ as input signals. A buffer or delay stage may be coupled between the output of the OR gate and the control terminal of the high-side transistor. Therefore, the high-side transistor may be active (and signal $OUT_N$ may be forced to the high value $V_{DD}$) when $TX_{DIS}=0$ and $PWM_{IN}=0$. The low-side transistor may be controlled by a respective control signal produced by an AND gate that receives an inverted replica of signal $TX_{DIS}$ and signal $PWM_{IN}$ as input signals. A buffer or delay stage may be coupled between the output of the AND gate and the control terminal of the low-side transistor. Therefore, the low-side transistor may be active (and signal $OUT_N$ may be forced to the low value $V_{SS}$) when $TX_{DIS}=0$ and $PWM_{IN}=1$. Both the high-side transistor and the low-side transistor may be inactive (and signal $OUT_N$ may be forced to the intermediate value $V_X$ under the operation of the output control circuit 806) when $TX_{DIS}=1$, irrespective of the value of signal $PWM_{IN}$.

As exemplified in FIG. 10, signal $PWM_{IN}$ may be slightly delayed (e.g., by a buffer stage 8011) before being propagated to the logic gates which drive the buffers 8021 and 8023.

As exemplified in FIG. 10, the output control circuit 806 may comprise a (e.g., resistive) voltage divider arranged between the positive supply voltage node $V_{DD}$ and the negative or reference supply voltage node $V_{SS}$. For instance, the voltage divider may comprise a series arrangement of two resistors R1 and R2; a node intermediate resistors R1 and R2 may produce the intermediate voltage level $V_X$. Optionally, resistors R1 and R2 may have the same resistance value, so that $V_X$ is centered with respect to the supply rail $V_{DD}$ to $V_{SS}$. The node intermediate resistors R1 and R2 may be selectively connected to the output nodes 802P and 802N of the buffer stages 8021 and 8023 by means of respective switches controlled by the control signal $TX_{DIS}$. The switches are set to a conductive state when the tri-state transmitter 802 is in the high impedance state (e.g., when $TX_{DIS}=1$). Optionally, a capacitance may be coupled in parallel to the resistor R2 between the intermediate node of the voltage divider and the negative or reference supply voltage node $V_{SS}$.

It is noted that, when operating in the high impedance state, the transmitter circuit 802' may be vulnerable to common mode transient pulses. Therefore, one or more embodiments as exemplified in FIG. 11 may additionally comprise a protection circuit 807. The protection circuit 807 may comprise a first capacitance $C_P$ and a second capacitance $C_N$ that are selectively couplable (e.g., by means of respective switches controlled by signal $TX_{DIS}$) to the nodes 802P and 802N, respectively. When $TX_{DIS}=0$ (active transmission of the tri-state transmitter 802), the capacitances $C_P$, $C_N$ are decoupled from the nodes 802P, 802N and are charged to $V_{DD}$ or $V_{SS}$ according to the value of the input signal $PWM_{IN}$. In particular, the capacitance $C_P$ may be charged to $V_{DD}$ when $PWM_{IN}=1$ and charged to $V_{SS}$ when $PWM_{IN}=0$; the capacitance $C_N$ may be charged to $V_{DD}$ when $PWM_{IN}=0$ and charged to $V_{SS}$ when $PWM_{IN}=1$. When $TX_{DIS}=1$ (high impedance state of the tri-state transmitter 802), the capacitances $C_P$ and $C_N$ are coupled to nodes 802P and 802N, respectively. Therefore, if a common mode pulse occurs in the signals $OUT_P$, $OUT_N$, the capacitances $C_P$, $C_N$ can absorb the current avoiding the generation of a spurious transition.

Figure 11:
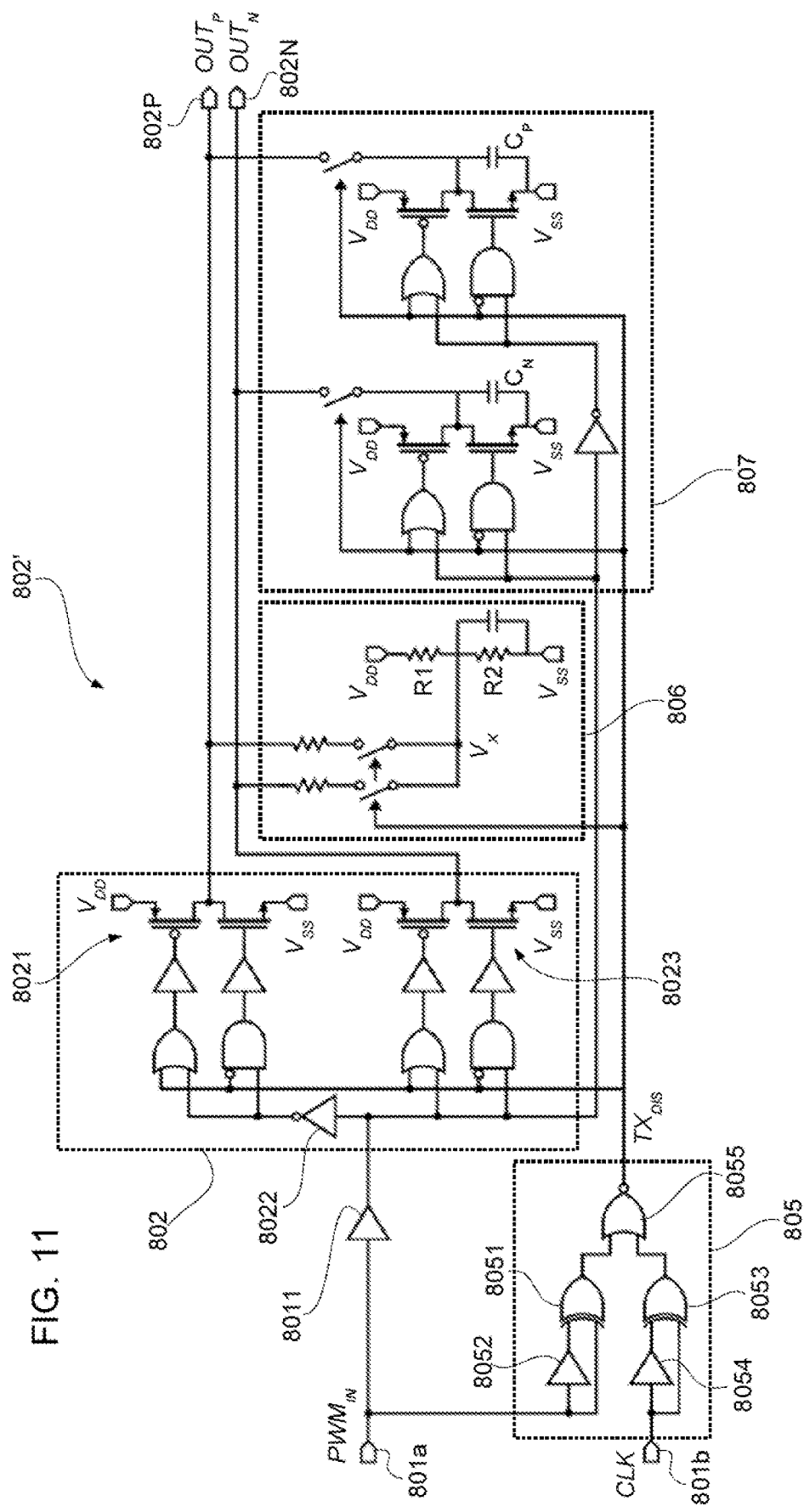

FIG. 11 is a circuit diagram exemplary of a possible implementation of a transmitter circuit 802' according to one or more embodiments. In particular, FIG. 11 is exemplary of possible implementation details of the protection circuit 807.

As exemplified in FIG. 11, the protection circuit 807 may comprise a first capacitance $C_P$ coupled to the output node of a respective half-bridge circuit connected between the positive supply voltage node $V_{DD}$ and the negative or reference supply voltage node $V_{SS}$. The half-bridge circuit may comprise a high-side transistor (e.g., p-channel MOS transistor) and a low-side transistor (e.g., n-channel MOS transistor). A node intermediate the high-side transistor and the low-side transistor may be coupled to the capacitance $C_P$, and may be selectively coupled to node 802P via a switch controlled by signal $TX_{DIS}$ (e.g., set to a conductive state when $TX_{DIS}=1$). The high-side transistor may be controlled by a respective control signal produced by an OR gate that receives signal $TX_{DIS}$ and an inverted replica of signal $PWM_{IN}$ as input signals. Therefore, the high-side transistor may be active (and the capacitance $C_P$ may be charged to $V_{DD}$) when $TX_{DIS}=0$ and $PWM_{IN}=1$. The low-side transistor may be controlled by a respective control signal produced by an AND gate that receives an inverted replica of signal $TX_{DIS}$ and an inverted replica of signal $PWM_{IN}$ as input signals. Therefore, the low-side transistor may be active (and the capacitance $C_P$ may be charged to $V_{SS}$) when $TX_{DIS}=0$ and $PWM_{IN}=0$. Both the high-side transistor and the low-side transistor may be inactive (and the capacitance $C_P$ may be coupled to node 802P) when $TX_{DIS}=1$, irrespective of the value of signal $PWM_{IN}$.

Similarly, the protection circuit 807 may comprise a second capacitance $C_N$ coupled to the output node of a respective half-bridge circuit connected between the positive supply voltage node $V_{DD}$ and the negative or reference supply voltage node $V_{SS}$. The half-bridge circuit may comprise a high-side transistor (e.g., p-channel MOS transistor) and a low-side transistor (e.g., n-channel MOS transistor). A node intermediate the high-side transistor and the low-side transistor may be coupled to the capacitance $C_N$, and may be selectively coupled to node 802N via a switch controlled by signal $TX_{DIS}$ (e.g., set to a conductive state when $TX_{DIS}=1$). The high-side transistor may be controlled by a respective control signal produced by an OR gate that receives signal $TX_{DIS}$ and signal $PWM_{IN}$ as input signals. Therefore, the high-side transistor may be active (and the capacitance $C_N$ may be charged to $V_{DD}$) when $TX_{DIS}=0$ and $PWM_{IN}=0$. The low-side transistor may be controlled by a respective control signal produced by an AND gate that receives an inverted replica of signal $TX_{DIS}$ and signal $PWM_{IN}$ as input signals. Therefore, the low-side transistor may be active (and the capacitance $C_N$ may be charged to $V_{SS}$) when $TX_{DIS}=0$ and $PWM_{IN}=1$. Both the high-side transistor and the low-side transistor may be inactive (and the capacitance $C_N$ may be coupled to node 802N) when $TX_{DIS}=1$, irrespective of the value of signal $PWM_{IN}$. Therefore, one or more embodiments as exemplified in FIG. 11 may provide improved common mode transient immunity (CMTI).

Figure 12:
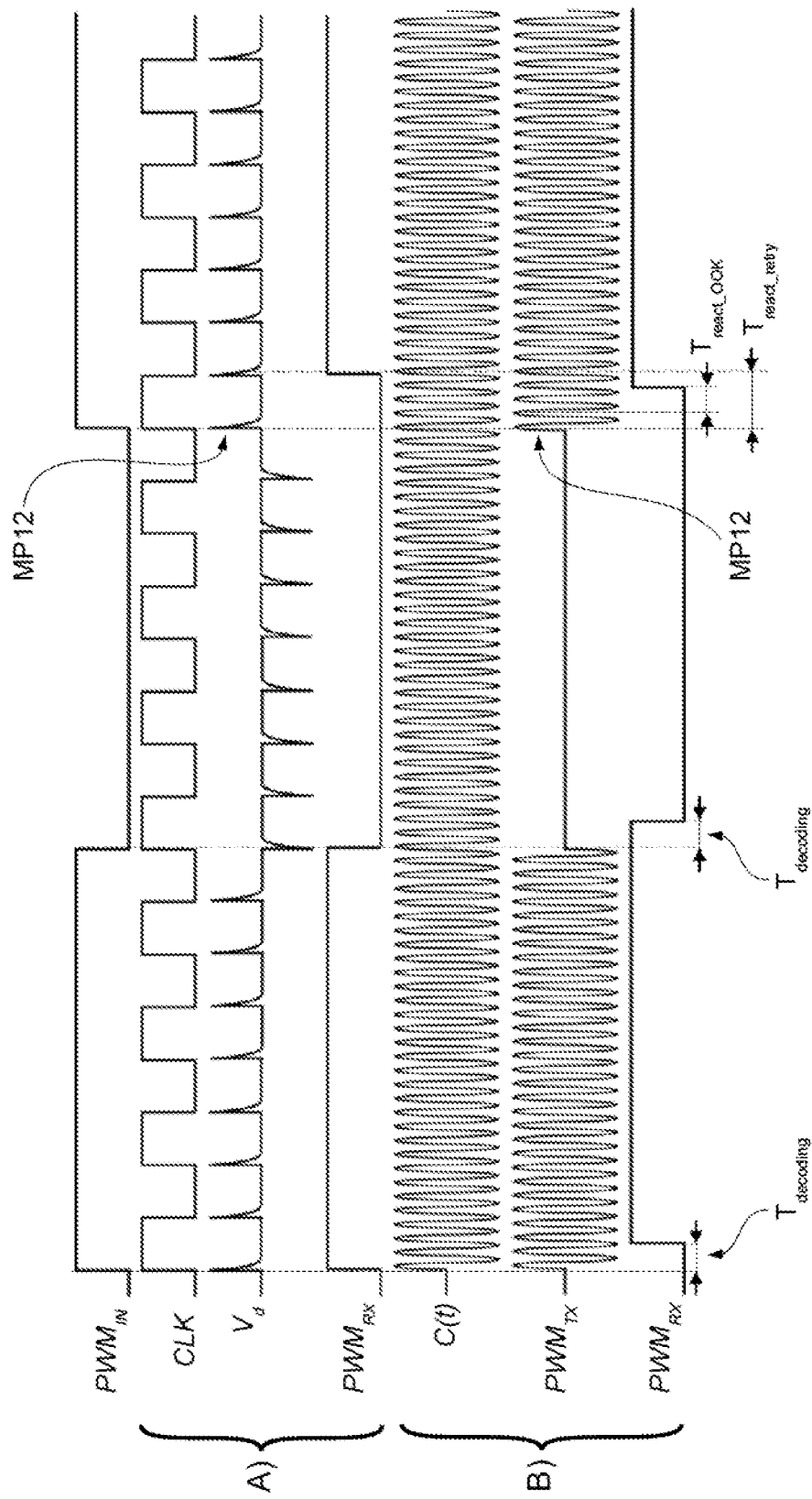
FIG. 12 is exemplary of a comparison between time diagrams of signals in one or more embodiments of the present description and time diagrams of signals in a transmitter circuit based on on-off keying modulation.

FIG. 12 is exemplary of a comparison between signals in an isolated driver device according to one or more embodiments (signals in portion A of FIG. 12), and signals in an isolated driver device based on OOK modulation (portion B of FIG. 12). As exemplified in FIG. 12, the reaction times (e.g., the time needed for "correcting" a missed pulse MP12 in the receiver high voltage die 10*b*) $T_{react\_OOK}$ and $T_{react\_retry}$ are comparable. Advantageously, in one or more embodiments (portion A) signal $PWM_{RX}$ does not suffer from a decoding delay $T_{decoding}$.

One or more embodiments have been disclosed herein, where the control signal $TX_{DIS}$ is generated as a function of the edges detected in both signals $PWM_{IN}$ and CLK. However, due to the frequency of signal CLK being higher than the frequency of signal $PWM_{IN}$, and considering that the edges of signal $PWM_{IN}$ may be coincident with certain edges of signal CLK (as exemplified in FIG. 9), one or more embodiments may generate the control signal $TX_{DIS}$ as a function of the edges detected in signal CLK only, without affecting the operating principle of the embodiments. For instance, in one or more embodiments the logic circuit 805 may include (only) the XOR gate 8053 and the delay stage 8054, and may include an inverter coupled to the output of the XOR gate 8053 to generate signal $TX_{DIS}$, in the place of the NOR gate 8055. On one hand, such simpler embodiments may be effective in applications where the frequency of the input PWM signal $PWM_{IN}$ is much lower than the frequency of the clock signal CLK. On the other hand, detecting edges in both signals $PWM_{IN}$ and CLK may improve the robustness of the transmission.

One or more embodiments may thus provide one or more of the following advantages:
- possibility of decoding the PWM input signal without delay;
- no need for an oscillator circuit for generating a high frequency carrier signal for modulation; and
- a simple implementation of the receiver circuit.

Without prejudice to the underlying principles, the details and embodiments may vary, even significantly, with respect to what has been described by way of example only, without departing from the extent of protection.

A circuit (802'), may be summarized as including a first input node (801*a*) configured to receive a pulse-width modulated input signal ($PWM_{IN}$); a second input node (801*b*) configured to receive a clock signal (CLK) having a frequency higher than the frequency of said pulse-width modulated input signal ($PWM_{IN}$); a logic circuit (805) sensitive to said clock signal (CLK) and configured to generate a control signal ($TX_{DIS}$) as a function of said clock signal (CLK), wherein said control signal ($TX_{DIS}$) is normally set to a first logic value, and is periodically set to a second logic value for a transmission time interval ($T_{HIZ}$) in response to an edge being detected in said clock signal (CLK), said transmission time interval ($T_{HIZ}$) being shorter than half clock period of said clock signal (CLK); a tri-state transmitter (802) coupled to the first input node (801*a*) to receive said pulse-width modulated input signal ($PWM_{IN}$) and sensitive to said control signal ($TX_{DIS}$), the tri-state transmitter (802) being configured to produce a first output signal ($OUT_P$) at a first transmitter output node (802P) and a second output signal ($OUT_N$) at a second transmitter output node (802N), the first output signal ($OUT_P$) and the second output signal ($OUT_N$) having a voltage swing between a positive supply voltage ($V_{DD}$) and a reference supply voltage ($V_{SS}$); an output control circuit (806) sensitive to said control signal ($TX_{DIS}$) and coupled to said first transmitter output node (802P) and said second transmitter output node (802N); wherein in response to said control signal ($TX_{DIS}$) having said first logic value, said tri-state transmitter (802) sets said first transmitter output node (802P) and said second transmitter output node (802N) to a high impedance state, and said output control circuit (806) drives said first transmitter output node (802P) and said second transmitter output node (802N) to an intermediate voltage level ($V_X$) between said positive supply voltage ($V_{DD}$) and said reference supply voltage ($V_{SS}$); and in response to said control signal ($TX_{DIS}$) having said second logic value, said tri-state transmitter (802) drives said first transmitter output node (802P) to said positive supply voltage ($V_{DD}$) or to said reference supply voltage ($V_{SS}$) according to the logic value of said pulse-width modulated input signal ($PWM_{IN}$), and drives said second transmitter output node (802P) to said positive supply voltage ($V_{DD}$) or to said reference supply voltage ($V_{SS}$) according to the inverted logic value of said pulse-width modulated input signal ($PWM_{IN}$), wherein said tri-state transmitter (802) is faster than said output control circuit (806) in driving said first transmitter output node (802P) and said second transmitter output node (802N).

Said tri-state transmitter (802) may drive said first transmitter output node (802P) and said second transmitter output node (802N) to said positive supply voltage ($V_{DD}$) and to said reference supply voltage ($V_{SS}$) with a respective transition time that may be at least 100 times shorter than the transition time with which said output control circuit (806)

may drive said first transmitter output node (802P) and said second transmitter output node (802N) to said intermediate voltage level ($V_X$).

Said tri-state transmitter (802) may drive said first transmitter output node (802P) and said second transmitter output node (802N) to said positive supply voltage ($V_{DD}$) and to said reference supply voltage ($V_{SS}$) with a respective transition time in the range of 10 ps to 100 ps, and said output control circuit (806) may drive said first transmitter output node (802P) and said second transmitter output node (802N) to said intermediate voltage level ($V_X$) with a respective transition time in the range of 30 ns to 40 ns.

Said logic circuit (805) may include a first delay circuit element (8054) configured to produce a delayed replica of said clock signal (CLK); a first XOR gate (8053) configured to receive said clock signal (CLK) and said delayed replica of said clock signal (CLK) as input; and an inverter circuit configured to invert the output signal from said first XOR gate (8053) to produce said control signal ($TX_{DIS}$).

Said logic circuit (805) may be further sensitive to said pulse-width modulated input signal ($PWM_{IN}$) and may be configured to generate said control signal ($TX_{DIS}$) further as a function of said pulse-width modulated input signal ($PWM_{IN}$), wherein said control signal ($TX_{DIS}$) may be set to said second logic value for said transmission time interval ($T_{HIZ}$) may be in response to an edge being detected in said pulse-width modulated input signal ($PWM_{IN}$).

Said logic circuit (805) may include a first delay circuit element (8054) configured to produce a delayed replica of said clock signal (CLK); a first XOR gate (8053) configured to receive said clock signal (CLK) and said delayed replica of said clock signal (CLK) as input; a second delay circuit element (8052) configured to produce a delayed replica of said pulse-width modulated input signal ($PWM_{IN}$); a second XOR gate (8051) configured to receive said pulse-width modulated input signal ($PWM_{IN}$) and said delayed replica of said pulse-width modulated input signal ($PWM_{IN}$) as input; and a NOR gate (8055) configured to receive the output signals from said first XOR gate (8053) and said second XOR gate (8051) to produce said control signal ($TX_{DIS}$).

Said tri-state transmitter (802) may include a first half-bridge circuit (8021) arranged between said positive supply voltage ($V_{DD}$) and said reference supply voltage ($V_{SS}$) and having an intermediate node coupled to said first transmitter output node (802P); and a second half-bridge circuit (8023) arranged between said positive supply voltage ($V_{DD}$) and said reference supply voltage ($V_{SS}$) and having an intermediate node coupled to said second transmitter output node (802N); wherein a high-side switch of said first half-bridge circuit (8021) may be conductive in response to said control signal ($TX_{DIS}$) having said second logic value and said pulse-width modulated input signal ($PWM_{IN}$) having a high logic value; a low-side switch of said first half-bridge circuit (8021) may be conductive in response to said control signal ($TX_{DIS}$) having said second logic value and said pulse-width modulated input signal ($PWM_{IN}$) having a low logic value; a high-side switch of said second half-bridge circuit (8023) may be conductive in response to said control signal ($TX_{DIS}$) having said second logic value and said pulse-width modulated input signal ($PWM_{IN}$) having a low logic value; a low-side switch of said second half-bridge circuit (8023) may be conductive in response to said control signal ($TX_{DIS}$) having said second logic value and said pulse-width modulated input signal ($PWM_{IN}$) having a high logic value; and said high-side switch and said low-side switch of said first half-bridge circuit (8021), as well as said high-side switch and said low-side switch of said second half-bridge circuit (8023), may be non-conductive in response to said control signal ($TX_{DIS}$) having said first logic value.

Said output control circuit (806) may include a voltage divider (R1, R2) arranged between said positive supply voltage ($V_{DD}$) and said reference supply voltage ($V_{SS}$), and respective switches configured to selectively couple an intermediate node of said voltage divider (R1, R2) to said first transmitter output node (802P) and said second transmitter output node (802N) in response to said control signal ($TX_{DIS}$) having said first logic value.

The circuit (802') may include a protection circuit (807), wherein the protection circuit (807) may include a first protection capacitance ($C_P$), a second protection capacitance ($C_N$), and protection circuitry configured to charge said first protection capacitance ($C_P$) to said positive supply voltage ($V_{DD}$) in response to said control signal ($TX_{DIS}$) having said second logic value and said pulse-width modulated input signal ($PWM_{IN}$) having a high logic value; charge said first protection capacitance ($C_P$) to said reference supply voltage ($V_{SS}$) in response to said control signal ($TX_{DIS}$) having said second logic value and said pulse-width modulated input signal ($PWM_{IN}$) having a low logic value; charge said second protection capacitance ($C_N$) to said positive supply voltage ($V_{DD}$) in response to said control signal ($TX_{DIS}$) having said second logic value and said pulse-width modulated input signal ($PWM_{IN}$) having a low logic value; charge said second protection capacitance ($C_N$) to said reference supply voltage ($V_{SS}$) in response to said control signal ($TX_{DIS}$) having said second logic value and said pulse-width modulated input signal ($PWM_{IN}$) having a high logic value; and couple said first protection capacitance ($C_P$) to said first transmitter output node (802P) and couple said second protection capacitance ($C_N$) to said second transmitter output node (802N) in response to said control signal ($TX_{DIS}$) having said first logic value.

The circuit (80*a*) may include a first differential output node (804P) and a second differential output node (804N); a first isolation capacitance (803P) coupled between said first transmitter output node (802P) and said first differential output node (804P); and a second isolation capacitance (803N) coupled between said second transmitter output node (802N) and said second differential output node (804N); wherein a differential output signal ($V_d$) indicative of said pulse-width modulated input signal ($PWM_{IN}$) may be produced between said first differential output node (804P) and said second differential output node (804N).

An isolated driver device, may be summarized as including a first semiconductor die having a transmitter circuit (80*a*) implemented thereon; a second semiconductor die having a first receiver input node and a second receiver input node, the first receiver input node being electrically coupled to the first differential output node (804P) of the transmitter circuit (80*a*) and the second receiver input node being electrically coupled to the second differential output node (804N) of the transmitter circuit (80*a*) to receive said differential output signal ($V_d$); wherein the second semiconductor die has a receiver circuit implemented thereon, the receiver circuit being configured to receive said differential output signal ($V_d$), and to set a driving signal ($PWM_{RX}$) to a first logic value in response to a positive pulse being detected in said differential output signal ($V_d$) and to a second logic value in response to a negative pulse being detected in said differential output signal ($V_d$).

The second semiconductor die may have a driver circuit implemented thereon, the driver circuit including a half-bridge circuit arranged between a positive supply voltage pin (VH) and a reference supply voltage pin (VL) and driven by said driving signal ($PWM_{RX}$) to produce an output switching signal (OUT).

An electronic system, may be summarized as including a processing unit configured to generate said pulse-width modulated input signal ($PWM_{IN}$) and said clock signal (CLK), and an isolated driver device coupled to the processing unit to receive said pulse-width modulated input signal ($PWM_{IN}$) and said clock signal (CLK).

A method of encoding a pulse-width modulated signal ($PWM_{IN}$) into a differential pulsed signal ($V_d$), the method may be summarized as including receiving said pulse-width modulated signal ($PWM_{IN}$); providing a clock signal (CLK) having a frequency higher than the frequency of said pulse-width modulated signal ($PWM_{IN}$); generating a control signal ($TX_{DIS}$) as a function of said clock signal (CLK), wherein said control signal ($TX_{DIS}$) is normally set to a first logic value, and is periodically set to a second logic value for a transmission time interval ($T_{HIZ}$) in response to an edge being detected in said clock signal (CLK), said transmission time interval ($T_{HIZ}$) being shorter than half clock period of said clock signal (CLK); producing a first output signal ($OUT_P$) and a second output signal ($OUT_N$), the first output signal ($OUT_P$) and the second output signal ($OUT_N$) having a voltage swing between a positive supply voltage ($V_{DD}$) and a reference supply voltage ($V_{SS}$); and applying capacitive filtering to said first output signal ($OUT_P$) and said second output signal ($OUT_N$) to produce respective first and second filtered output signals, wherein said differential pulsed signal ($V_d$) is produced as a difference between said first filtered output signal and said second filtered output signal; wherein producing said first output signal ($OUT_P$) and said second output signal ($OUT_N$) includes in response to said control signal ($TX_{DIS}$) having said first logic value, setting said first output signal ($OUT_P$) and said second output signal ($OUT_N$) to an intermediate voltage level ($V_X$) between said positive supply voltage ($V_{DD}$) and said reference supply voltage ($V_{SS}$); and in response to said control signal ($TX_{DIS}$) having said second logic value, setting said first output signal ($OUT_P$) to said positive supply voltage ($V_{DD}$) or to said reference supply voltage ($V_{SS}$) according to the logic value of said pulse-width modulated input signal ($PWM_{IN}$), and setting said second output signal ($OUT_N$) to said positive supply voltage ($V_{DD}$) or to said reference supply voltage ($V_{SS}$) according to the inverted logic value of said pulse-width modulated input signal ($PWM_{IN}$), wherein a time interval for setting said first output signal ($OUT_P$) and said second output signal ($OUT_N$) to said positive supply voltage ($V_{DD}$) or to said reference supply voltage ($V_{SS}$) is shorter than a time interval for setting said first output signal ($OUT_P$) and said second output signal ($OUT_N$) to said intermediate voltage level ($V_X$).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
 a first input node configured to receive a pulse-width modulated input signal;
 a second input node configured to receive a clock signal having a frequency higher than a frequency of said pulse-width modulated input signal;
 a logic circuit sensitive to said clock signal and configured to generate a control signal as a function of said clock signal, wherein said control signal is normally set to a first logic value, and is periodically set to a second logic value for a transmission time interval in response to an edge being detected in said clock signal, said transmission time interval being shorter than a half clock period of said clock signal;
 a tri-state transmitter coupled to the first input node to receive said pulse-width modulated input signal and sensitive to said control signal, the tri-state transmitter being configured to produce a first output signal at a first transmitter output node and a second output signal at a second transmitter output node, the first output signal and the second output signal having a voltage swing between a positive supply voltage and a reference supply voltage; and
 an output control circuit sensitive to said control signal and coupled to said first transmitter output node and said second transmitter output node,
 wherein:
  in response to said control signal having said first logic value, said tri-state transmitter sets said first transmitter output node and said second transmitter output node to a high impedance state, and said output control circuit drives said first transmitter output node and said second transmitter output node to an intermediate voltage level between said positive supply voltage and said reference supply voltage; and
  in response to said control signal having said second logic value, said tri-state transmitter drives said first transmitter output node to said positive supply voltage or to said reference supply voltage according to the logic value of said pulse-width modulated input signal, and drives said second transmitter output node to said positive supply voltage or to said reference supply voltage according to an inverted logic value of said pulse-width modulated input signal,
  wherein said tri-state transmitter is faster than said output control circuit in driving said first transmitter output node and said second transmitter output node.

2. The circuit of claim 1, wherein said tri-state transmitter is configured to drive said first transmitter output node and said second transmitter output node to said positive supply voltage and to said reference supply voltage with a respective transition time that is at least 100 times shorter than the transition time with which said output control circuit drives said first transmitter output node and said second transmitter output node to said intermediate voltage level.

3. The circuit of claim 1, wherein said tri-state transmitter is configured to drive said first transmitter output node and said second transmitter output node to said positive supply voltage and to said reference supply voltage with a respective transition time in a range of 10 ps to 100 ps, and wherein said output control circuit drives said first transmitter output node and said second transmitter output node to said intermediate voltage level with a respective transition time in a range of 30 ns to 40 ns.

4. The circuit of claim 1, wherein said logic circuit includes:
 a first delay circuit element configured to produce a delayed replica of said clock signal;

a first XOR gate configured to receive said clock signal and said delayed replica of said clock signal as input; and an inverter circuit configured to invert the output signal from said first XOR gate to produce said control signal.

5. The circuit of claim 1, wherein said logic circuit is further sensitive to said pulse-width modulated input signal and is configured to generate said control signal further as a function of said pulse-width modulated input signal, wherein said control signal is set to said second logic value for said transmission time interval in response to an edge being detected in said pulse-width modulated input signal.

6. The circuit of claim 5, wherein said logic circuit includes:
a first delay circuit element configured to produce a delayed replica of said clock signal;
a first XOR gate configured to receive said clock signal and said delayed replica of said clock signal as input;
a second delay circuit element configured to produce a delayed replica of said pulse-width modulated input signal;
a second XOR gate configured to receive said pulse-width modulated input signal and said delayed replica of said pulse-width modulated input signal as input; and
a NOR gate configured to receive the output signals from said first XOR gate and said second XOR gate to produce said control signal.

7. The circuit of claim 1, wherein said tri-state transmitter includes:
a first half-bridge circuit arranged between said positive supply voltage and said reference supply voltage and having an intermediate node coupled to said first transmitter output node; and
a second half-bridge circuit arranged between said positive supply voltage and said reference supply voltage and having an intermediate node coupled to said second transmitter output node,
wherein:
a high-side switch of said first half-bridge circuit is conductive in response to said control signal having said second logic value and said pulse-width modulated input signal having a high logic value;
a low-side switch of said first half-bridge circuit is conductive in response to said control signal having said second logic value and said pulse-width modulated input signal having a low logic value;
a high-side switch of said second half-bridge circuit is conductive in response to said control signal having said second logic value and said pulse-width modulated input signal having a low logic value;
a low-side switch of said second half-bridge circuit is conductive in response to said control signal having said second logic value and said pulse-width modulated input signal having a high logic value; and
said high-side switch and said low-side switch of said first half-bridge circuit, as well as said high-side switch and said low-side switch of said second half-bridge circuit, are non-conductive in response to said control signal having said first logic value.

8. The circuit of claim 1, wherein said output control circuit includes:
a voltage divider arranged between said positive supply voltage and said reference supply voltage; and
respective switches configured to selectively couple an intermediate node of said voltage divider to said first transmitter output node and said second transmitter output node in response to said control signal having said first logic value.

9. The circuit of claim 1, comprising a protection circuit, wherein the protection circuit includes a first protection capacitance, a second protection capacitance, and protection circuitry configured to:
charge said first protection capacitance to said positive supply voltage in response to said control signal having said second logic value and said pulse-width modulated input signal having a high logic value;
charge said first protection capacitance to said reference supply voltage in response to said control signal having said second logic value and said pulse-width modulated input signal having a low logic value;
charge said second protection capacitance to said positive supply voltage in response to said control signal having said second logic value and said pulse-width modulated input signal having a low logic value;
charge said second protection capacitance to said reference supply voltage in response to said control signal having said second logic value and said pulse-width modulated input signal having a high logic value; and
couple said first protection capacitance to said first transmitter output node and couple said second protection capacitance to said second transmitter output node in response to said control signal having said first logic value.

10. The circuit of claim 1, comprising:
a first differential output node and a second differential output node;
a first isolation capacitance coupled between said first transmitter output node and said first differential output node; and
a second isolation capacitance coupled between said second transmitter output node and said second differential output node,
wherein a differential output signal indicative of said pulse-width modulated input signal is produced between said first differential output node and said second differential output node.

11. An isolated driver device, comprising:
a first semiconductor die having a transmitter circuit implemented thereon, the transmitter circuit including:
a first input node configured to receive a pulse-width modulated input signal;
a second input node configured to receive a clock signal having a frequency higher than a frequency of said pulse-width modulated input signal;
a logic circuit sensitive to said clock signal and configured to generate a control signal as a function of said clock signal, wherein said control signal is normally set to a first logic value, and is periodically set to a second logic value for a transmission time interval in response to an edge being detected in said clock signal, said transmission time interval being shorter than a half clock period of said clock signal;
a tri-state transmitter coupled to the first input node to receive said pulse-width modulated input signal and sensitive to said control signal, the tri-state transmitter being configured to produce a first output signal at a first transmitter output node and a second output signal at a second transmitter output node, the first output signal and the second output signal having a voltage swing between a positive supply voltage and a reference supply voltage;

an output control circuit sensitive to said control signal and coupled to said first transmitter output node and said second transmitter output node, wherein:

in response to said control signal having said first logic value, said tri-state transmitter sets said first transmitter output node and said second transmitter output node to a high impedance state, and said output control circuit drives said first transmitter output node and said second transmitter output node to an intermediate voltage level between said positive supply voltage and said reference supply voltage; and in response to said control signal having said second logic value, said tri-state transmitter drives said first transmitter output node to said positive supply voltage or to said reference supply voltage according to the logic value of said pulse-width modulated input signal, and drives said second transmitter output node to said positive supply voltage or to said reference supply voltage according to an inverted logic value of said pulse-width modulated input signal, wherein said tri-state transmitter is faster than said output control circuit in driving said first transmitter output node and said second transmitter output node; and a second semiconductor die having a first receiver input node and a second receiver input node, the first receiver input node being electrically coupled to a first differential output node of the transmitter circuit and the second receiver input node being electrically coupled to a second differential output node of the transmitter circuit to receive a differential output signal, wherein the second semiconductor die has a receiver circuit implemented thereon, the receiver circuit being configured to receive said differential output signal, and to set a driving signal to a first logic value in response to a positive pulse being detected in said differential output signal and to a second logic value in response to a negative pulse being detected in said differential output signal.

12. The isolated driver device of claim 11, wherein the second semiconductor die has a driver circuit implemented thereon, the driver circuit including a half-bridge circuit arranged between a positive supply voltage pin and a reference supply voltage pin and driven by said driving signal to produce an output switching signal.

13. The isolated driver device of claim 11, wherein said tri-state transmitter is configured to drive said first transmitter output node and said second transmitter output node to said positive supply voltage and to said reference supply voltage with a respective transition time that is at least 100 times shorter than the transition time with which said output control circuit drives said first transmitter output node and said second transmitter output node to said intermediate voltage level.

14. The isolated driver device of claim 11, wherein said tri-state transmitter is configured to drive said first transmitter output node and said second transmitter output node to said positive supply voltage and to said reference supply voltage with a respective transition time in a range of 10 ps to 100 ps, and wherein said output control circuit drives said first transmitter output node and said second transmitter output node to said intermediate voltage level with a respective transition time in a range of 30 ns to 40 ns.

15. The isolated driver device of claim 11, wherein said logic circuit includes:

a first delay circuit element configured to produce a delayed replica of said clock signal;

a first XOR gate configured to receive said clock signal and said delayed replica of said clock signal as input; and an inverter circuit configured to invert the output signal from said first XOR gate to produce said control signal.

16. An electronic system, comprising:

an isolated driver device according to claim 11; and processing circuitry configured to generate said pulse-width modulated input signal and said clock signal, the isolated driver device coupled to a processing unit to receive said pulse-width modulated input signal and said clock signal.

17. The electronic system of claim 16, wherein the second semiconductor die has a driver circuit implemented thereon, the driver circuit including a half-bridge circuit arranged between a positive supply voltage pin and a reference supply voltage pin and driven by said driving signal to produce an output switching signal.

18. The electronic system of claim 16, wherein said tri-state transmitter is configured to drive said first transmitter output node and said second transmitter output node to said positive supply voltage and to said reference supply voltage with a respective transition time that is at least 100 times shorter than the transition time with which said output control circuit drives said first transmitter output node and said second transmitter output node to said intermediate voltage level.

19. A method of encoding a pulse-width modulated signal into a differential pulsed signal, the method comprising:

receiving said pulse-width modulated signal;

providing a clock signal having a frequency higher than the frequency of said pulse-width modulated signal;

generating a control signal as a function of said clock signal, wherein said control signal is normally set to a first logic value, and is periodically set to a second logic value for a transmission time interval in response to an edge being detected in said clock signal, said transmission time interval being shorter than a half clock period of said clock signal;

producing a first output signal and a second output signal, the first output signal and the second output signal having a voltage swing between a positive supply voltage and a reference supply voltage; and applying capacitive filtering to said first output signal and said second output signal to produce respective first and second filtered output signals, wherein said differential pulsed signal is produced as a difference between said first filtered output signal and said second filtered output signal, wherein producing said first output signal and said second output signal includes:

in response to said control signal having said first logic value, setting said first output signal and said second output signal to an intermediate voltage level between said positive supply voltage and said reference supply voltage; and in response to said control signal having said second logic value, setting said first output signal to said positive supply voltage or to said reference supply voltage according to the logic value of a pulse-width modulated input signal, and setting said second output signal to said positive supply voltage or to said reference supply voltage according to an inverted logic value of said pulse-width modulated input signal, wherein a time interval for setting said first output signal and said second output signal to said positive supply voltage or to said reference supply voltage is shorter than a time interval for setting said first output signal and said second output signal to said intermediate voltage level.

20. The method of claim 19, wherein generating the control signal includes generating said control signal further as a function of said pulse-width modulated input signal, wherein said control signal is set to said second logic value for said time interval in response to an edge being detected in said pulse-width modulated input signal.

* * * * *